(12) United States Patent
Tobe

(10) Patent No.: US 7,071,079 B2
(45) Date of Patent: Jul. 4, 2006

(54) EPITAXIAL WAFER AND A METHOD FOR PRODUCING IT

(75) Inventor: Satoshi Tobe, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/487,043

(22) PCT Filed: Aug. 21, 2002

(86) PCT No.: PCT/JP02/08437

§ 371 (c)(1),
(2), (4) Date: Feb. 18, 2004

(87) PCT Pub. No.: WO03/019647

PCT Pub. Date: Mar. 6, 2003

(65) Prior Publication Data

US 2004/0180505 A1 Sep. 16, 2004

(30) Foreign Application Priority Data

Aug. 23, 2001 (JP) ............................. 2001-253510

(51) Int. Cl.
*H01L 21/322* (2006.01)
(52) U.S. Cl. ................. 438/471; 257/617; 257/E21.321
(58) Field of Classification Search ................ 257/610; 117/11, 12, 13; 438/471, 472, 473, 474, 438/475, 476, 477
See application file for complete search history.

(56) References Cited

U.S. PATENT DOCUMENTS

| | | | |
|---|---|---|---|
| 6,191,009 B1 | | 2/2001 | Tamatsuka et al. |
| 6,548,035 B1 | * | 4/2003 | Kimura et al. |
| 6,548,886 B1 | * | 4/2003 | Ikari et al. |
| 2003/0079674 A1 | * | 5/2003 | Tachikawa et al |

FOREIGN PATENT DOCUMENTS

| | | | |
|---|---|---|---|
| EP | 0 942 078 A1 | | 9/1999 |
| EP | 0942078 A1 | * | 9/1999 |
| EP | 1 035 236 A1 | | 9/2000 |
| EP | 1035236 A1 | * | 9/2000 |
| JP | A 60-251190 | | 12/1985 |
| JP | A 2000-109396 | | 4/2000 |
| JP | A 2002-76006 | | 3/2002 |

OTHER PUBLICATIONS

E. Dornberger et al.; "Silicon crystals for future requirements of 300 mm wafers"; Journal of Crystal Growth 22912; 2001; pp. 11-16.

* cited by examiner

Primary Examiner—Nathan J. Flynn
Assistant Examiner—Kevin Quinto
(74) Attorney, Agent, or Firm—Oliff & Berridge PLC

(57) ABSTRACT

The present invention provides an epitaxial wafer wherein a silicon epitaxial layer is formed on a surface of a silicon single crystal wafer in which nitrogen is doped, and a density of oxide precipitates having such a size that a gettering capability can be achieved in a bulk is $10^8$ numbers/$cm^3$ or more. And the present invention also provides a method for producing an epitaxial wafer wherein a silicon single crystal in which nitrogen is doped is pulled by Czochralski method, the silicon single crystal is processed into a wafer to produce a silicon single crystal wafer, and the silicon single crystal wafer is subjected to heat treatment so that a density of oxide precipitates having such a size that a gettering capability can be achieved in a bulk of the wafer may be $10^8$ numbers/$cm^3$ or more, and then the silicon single crystal wafer is subjected to epitaxial growth. A silicon single crystal wafer which surely has a high gettering capability irrespective of a device process can be obtained herewith.

1 Claim, No Drawings

EPITAXIAL WAFER AND A METHOD FOR PRODUCING IT

TECHNICAL FIELD

The present invention relates to an epitaxial wafer in which BMD (Bulk Micro Defect) which is sufficient as a gettering site is formed in an inner part of the wafer in order to afford a sufficient gettering capability to the wafer irrespective of the device fabrication heat treatment to which the wafer is subjected (especially heat treatment at low temperature for a short time), and a method for producing it.

BACKGROUND TECHNOLOGY

As a wafer for producing a device, such as a semiconductor integrated circuit, a silicon single crystal wafer grown by the CZ method is mainly used. If a portion near the surface of this silicon single crystal wafer is made defect-free as much as possible, a quality of the device will be improved. One of the most effective methods is an epitaxial wafer, and excellence thereof has been almost proved.

On the other hand, formation of a high-density defect (BMD) in a bulk of a wafer is more advantageous to the production of a device. Because there are quite a lot of opportunities where it is exposed to contamination with a heavy metal impurity during a device fabrication heat treatment, and the heavy metal may affect adversely on device operation, a demand for removing it from a portion near the surface which is a device fabrication range is often arisen. A gettering technique is a method of meeting the demand, and BMDs are sometimes formed in a bulk of a wafer as a gettering site in the gettering technique.

Although the silicon single crystal manufactured by Czochralski (CZ) method contains oxygen inevitably in a manufacturing process, it is possible to control the oxygen concentration and CZ-silicon wafers with various oxygen concentrations are manufactured according to the purpose. If these oxygen atoms are subjected to heat treatment, oxide precipitates will be formed in the inner part of the wafer. This is a main component of BMD. Not a little distortion of a crystal lattice exists around the BMDs, and a heavy metal impurity is captured by the distortion. This is a method called IG (Internal Gettering) among the various gettering techniques.

Generally, some methods can be considered to apply the IG method. The simplest method is a method of forming BMDs simultaneously during a device fabrication heat treatment. Although it is effective when the device fabrication heat treatment is performed at a high temperature, effectiveness cannot be achieved at the low temperature as 1000° C. or less. Especially the device process tends to be performed at lower temperature in recent years and it is impossible to expect formation of BMDs. In the case that a strong gettering capability is also necessary even when such a low-temperature process is used, there can also be adopted a method of forming BMDs before a device process. It is called DZ (Denuded Zone)-IG, which is a method wherein the oxygen atoms near a surface are out-diffused by a high temperature heat treatment and emitted out of the wafer, and then subjected to two-step heat treatment for formation of nuclei of oxygen precipitation and growth, to obtain a BMD density serving the purpose. However, according to the method, heat treatment is complicated, a long time is required and cost is very high.

As means for forming BMDs required for gettering in a bulk of a wafer easily, there have been recently used a method of doping nitrogen to a silicon single crystal to be pulled according to the CZ method. It is known that if nitrogen and oxygen exist together in silicon, a rate of formation of nuclei of oxygen precipitation will be raised, and thus BMDs can be formed easily. Since the silicon wafer manufactured by this method has a high BMD density, it has been considered that it is an optimal wafer for gettering.

The wafer which can realize simultaneously both of the gettering capability of the nitrogen doped wafer and an excellent surface quality is an epitaxial wafer wherein a nitrogen doped wafer is used as a substrate. It has been considered that it has a higher gettering capability compared with a conventional epitaxial wafer, since it contains BMD from the beginning. Actually, the wafer after subjected to a device fabrication heat treatment was characterized in having sufficient gettering capability, since BMD might be grown further.

However, there is a recent tendency of performing a device fabrication heat treatment by RTA (Rapid Thermal Annealing) in addition to a tendency of performing it at a low-temperature. That is, the device fabrication heat treatment which had taken several hours until now will be carried out in several seconds to several minutes. In the heat treatment for such a short time, it can be hardly expected that BMDs are formed or grown in the process. In the wafer after subjected to such a device fabrication heat treatment, a gettering capability is sometimes insufficient, even in the case that the BMD density detected in the bulk of the wafer is about $10^8$ numbers/cm$^3$ which is considered to be a sufficient BMD density.

DISCLOSURE OF THE INVENTION

The present invention has been made in order to solve such problems. The object of the present invention is to obtain an epitaxial wafer which surely has a high gettering capability, irrespective of the device process to which the wafer is subjected later.

To achieve the above-mentioned object, the present invention provides an epitaxial wafer wherein a silicon epitaxial layer is formed on a surface of a silicon single crystal wafer in which nitrogen is doped, and a density of oxide precipitates having such a size that a gettering capability can be achieved in a bulk is $10^8$ numbers/cm$^3$ or more.

In such an epitaxial wafer wherein a density of oxide precipitates having such a size that the gettering capability can be achieved in the bulk of the substrate on which a silicon epitaxial layer is formed is $10^8$ numbers/cm$^3$ or more, a sufficient gettering capability can be achieved even in the case that the wafer is then subjected to a device process performed according to RTA or at low temperature, since there exists BMDs having such a size that the gettering capability can be achieved at a sufficient density. Furthermore, since the epitaxial layer is formed on the surface of the wafer, the quality of the surface of the wafer will also be excellent.

It surely has a gettering capability if the size of oxide precipitates is a radius of 30–40 nm (when a configuration is assumed to be spherical) which is a size detectable with an optical measuring apparatus currently used. However, it has been confirmed that those having a smaller size may have a gettering capability as far as it is 10 nm or more in radius, as a result of observation with a transmission electron microscope (TEM).

Moreover, the present invention provides a method for producing an epitaxial wafer wherein a silicon single crystal in which nitrogen is doped is pulled by Czochralski method, the silicon single crystal is processed into a wafer to produce a silicon single crystal wafer, and the silicon single crystal wafer is subjected to heat treatment so that a density of oxide precipitates having such a size that a gettering capability can be achieved in a bulk of the wafer may be $10^8$ numbers/cm$^3$ or more, and then the silicon single crystal wafer is subjected to epitaxial growth.

There can be obtained a wafer wherein there exists BMDs having such a size that a sufficient gettering capability can be achieved in the bulk of the wafer at a sufficient density by subjecting a silicon single crystal wafer to heat treatment to make a density of oxide precipitates having such a size that the gettering capability can be achieved in a bulk of the wafer $10^8$ numbers/cm$^3$ or more and then by performing epitaxial growth, as described above. Therefore, the wafer having a gettering capability which meets the demand can be produced even if the wafer is then subjected to a device process according to RTA or at low temperature. Moreover, since nitrogen is doped in the silicon single crystal, it is not necessary to perform a complicated heat treatment for a long time which should be performed in the wafer where nitrogen is not doped. It is enough to perform a comparatively easy and short-time heat treatment. Since an epitaxial layer is formed on the surface of the wafer by epitaxial growth, the surface quality of the wafer is also excellent.

Since the size of oxide precipitates may be reduced by the epitaxial growth at high temperature performed later, the heat treatment of the silicon single crystal wafer is preferably conducted so that the size of oxide precipitates may be a radius of 30–40 nm or more and the density thereof may be $10^9$/cm$^3$ or more. Namely, as a result, the oxide precipitates having such a size that the gettering capability can be achieved in the epitaxial wafer after epitaxial growth may exist at a density of $10^8$ numbers/cm$^3$ or more.

In this case, it is desirable to perform the heat treatment which consists of a first heat treatment at 600° C.–1000° C. for 0.5 hours to 8 hours and a second heat treatment at 800° C.–1150° C. for 0 hour to 10 hours as the above-mentioned heat treatment performed to the silicon single crystal wafer.

This reason is that even though the formation of the nuclei of oxygen precipitation is promoted by doping nitrogen, an oxygen precipitation process is divided into two phases consisting of formation of nuclei of precipitation and growth. And in each step of them, the optimal temperature and the optimal time are different depending on initial oxygen concentration, concentration of doped nitrogen, or the like, and they need to be optimized in order to determine the conditions for the heat treatment. Therefore, the conditions to achieve the effect of the present invention is to perform the heat treatment consisting of the first heat treatment at 600° C. to 1000° C. for 0.5 hours to 8 hours and the second heat treatment at 800° C. to 1150° C. for 0 hour to 10 hours, and thereby BMDs having a required size of 10 nm or more by which gettering capability can be surely achieved can be formed in a bulk of wafer at a necessary density.

In this case, the concentration of nitrogen doped to the silicon single crystal when pulling the above-mentioned nitrogen doped silicon single crystal is preferably $10^{13}$ to $10^{14}$ atoms/cm$^3$.

As described above, it is known that formation of nuclei of oxygen precipitation is promoted by doping nitrogen into a silicon crystal. Since the density that the effect of doping of nitrogen can be surely achieved is $1\times10^{13}$ atoms/cm$^3$ in that case, and therefore it is preferable that the density is the value or more. On the other hand, if the concentration of nitrogen is $1\times10^{14}$ atoms/cm$^3$ or less, the defects in the epitaxial layer such as a stacking fault (SF) formed due to the defect on the surface of a silicon wafer are suppressed remarkably. Accordingly, the concentration is preferably the value or less.

As described above, according to the present invention, an epitaxial wafer with high gettering capability can be obtained by an easy method, irrespective of the device process performed later.

BEST MODE FOR CARRYING OUT THE INVENTION

The present invention will be explained below in detail.

The inventor of the present invention has studied thoroughly in order to get an epitaxial wafer which has a gettering capability irrespective of a device process. It has been considered that when BMD density is measured as for the conventional wafer wherein epitaxial growth is performed to a silicon single crystal wafer in which nitrogen is doped, after performing the heat treatment for growing oxide precipitates in a bulk to a detectable size (for example, 800° C./4 h+1000° C./16 h), BMDs exist at about $10^8$ numbers/cm$^3$ before putting it into a device process, and has a high gettering capability. However, the required gettering capability has not been able to be achieved in some cases depending on the device process performed after that.

Then, the inventor has investigated BMDs in a bulk in detail using the transmission electron microscope as for an as-grown nitrogen doped silicon single crystal wafer wherein the silicon single crystal in which nitrogen is doped is processed into the wafer, or the epitaxial wafer wherein the epitaxial layer is just grown on it. As a result, it has been revealed that the detected BMDs surely exist at a density of about $10^8$ numbers/cm$^3$, but the size of most of BMDs is less than a radius of 10 nm. On the other hand investigation was similarly conducted as for the wafer which is subjected to the heat treatment at high temperature and for prolonged time such as DZ-IG, and has a necessary gettering capability, and it has been revealed that the size of the BMDs exceeds a radius of 10 nm, and a radius of most of them exceeds 30–40 nm which is a size detectable with an optical measuring apparatus, even if it has the same BMD density.

It was expected from the above fact that the size of at least a radius of 10 nm or more, preferably a radius of 30 nm or more is necessary for BMDs in order to actually achieve a gettering capability, and the wafer which demonstrates gettering capability can be provided irrespective of the later device process by making a size of BMD at least a radius of 10 nm or more.

Then, the inventor of the present invention thought of increasing the BMD density having the size which actually has a gettering capability by subjecting the silicon single crystal wafer to which nitrogen is doped to the heat treatment, before performing epitaxial growth, and growing the size of BMDs. The heat treatment in this case is not the above-mentioned heat treatment performed by above-mentioned DZ-IG. Necessary BMDs can be formed by a relatively easy heat treatment for a short time, since nitrogen is doped to the wafer.

The present invention has been completed by studying the conditions based on such a basic idea.

Although the present invention will be explained more in detail below, it is not limited thereto.

In the present invention, the silicon single crystal ingot in which nitrogen is doped can be grown according to the CZ method based on a well-known method as disclosed by Japanese Patent Application Laid-Open (Kokai) No. 60-251190.

Namely, CZ method is a method wherein a silicon single crystal ingot with a desired diameter is grown by bringing a seed crystal into contact with a melt of polycrystal silicon raw material in a quartz crucible, and pulling it slowly with rotating, and nitrogen can be doped in the pulled crystal by putting a nitride in the quartz crucible beforehand, supplying a nitride in a silicon melt, or using an atmosphere containing nitrogen, etc. In this case, the amount of doped nitrogen in the crystal can be controlled by regulating the amount of nitride, or concentration or introducing time of nitrogen gas or the like.

As described above, condensation of the oxygen atoms in silicon can be promoted and a density of oxide precipitates can be made high by doping nitrogen when a single crystal ingot is pulled according to the CZ method. In this case, nitrogen concentration is desirably $1 \times 10^{13}$ to $1 \times 10^{14}$ atoms/cm$^3$. Since nuclei of oxygen precipitation are certainly formed in the state of as-grown if concentration of nitrogen is $1 \times 10^{13}$ or more, the epitaxial wafer wherein a density of oxide precipitates having such a size that a gettering capability after heat treatment can be achieved is $1 \times 10^8$ atoms/cm$^3$ can be surely produced. If a nitrogen concentration is $1 \times 10^{14}$ atoms/cm$^3$ or less, crystal defects formed in the epitaxial layer resulting from the silicon wafer which is a substrate, such as a stacking fault (SF), are suppressed remarkably.

In this way, the silicon single crystal ingot in which nitrogen is doped with predetermined concentration can be obtained according to CZ method. It is processed into a silicon single crystal wafer by slicing it with a cutting equipment such as an inner diameter slicer or a wire sow, according to the conventional method, and then subjecting to processes such as chamfering, lapping, etching, polishing and the like. Of course, these processes are just listed as an example, and there can be included other various processes such as grinding, washing and the like. Furthermore, the processes are carried out suitably with alteration in accordance with changing the order of the processes, omitting a part of the processes, or the like, depending on the purpose.

Next, the wafer is subjected to the heat treatment so that the density of oxide precipitates having such a size that the gettering capability can be achieved in the bulk of the epitaxial wafer after epitaxial growth, for example, a radius of 10 nm or more may be $10^8$ numbers/cm$^3$ or more. Since the size of oxide precipitates may be reduced by the epitaxial growth performed after that, this heat treatment is preferably performed so that the density of oxide precipitates with a radius of 30–40 nm or more may be $10^9$ numbers/cm$^3$ or more. As a result, a density of oxide precipitates with a radius of 10 nm or more in the epitaxial wafer after epitaxial growth is made $10^8$ numbers/cm$^3$ or more. This heat treatment can be performed according to any method as far as it can grow the size of the oxide precipitates in the bulk and can make the density of the oxide precipitates of the above-mentioned size $10^8$ numbers/cm$^3$ or more. Especially, nitrogen is doped in the silicon single crystal wafer according to the present invention, and thus a desired BMD can be formed with a relatively short-time heat treatment.

However, even though formation of nuclei of oxygen precipitation is promoted by doping of nitrogen, a process of oxygen precipitation is divided into two steps of formation of nucleus of precipitation and growth. In each of the steps, the optimal temperature and the optimal time are different depending on initial oxygen concentration, concentration of doped nitrogen, or the like, and it is necessary to optimize them in order to determine the heat treatment conditions. Therefore, in order to surely achieve the effectiveness of the present invention, especially in the case that concentration of nitrogen in a silicon single crystal is $10^{13}$–$10^{14}$ atoms/cm$^3$, the condition of the heat treatment is preferably as follows: the heat treatment which consists of the first heat treatment performed at 600° C.–1000° C. for 0.5 hours to 8 hours and the second heat treatment performed at 800° C.–1150° C. for 0 hour to 10 hours.

Formation of new nuclei of precipitation cannot be expected when the first heat treatment is performed at lower than 600° C., but when it exceeds 1000° C., there is a possibility that the nuclei of precipitation which already exist are extinguished. On the other hand, if the second heat treatment is performed at lower than 800° C., growth of precipitation takes a long time and it is not effective, but it exceeds 1150° C., a slip dislocation, metal contamination or the like is likely caused.

Only the first heat treatment is performed when the second heat treatment time is 0 hour. However, if the heat treatment is performed at a comparatively high temperature for comparatively long time within the range of the condition of the first heat treatment, the intended oxide precipitates can be obtained, since nitrogen is doped.

The atmosphere in which the heat treatment is performed is not especially limited, and it may be an inert gas, such as hydrogen, nitrogen, or argon, or mixed gas thereof, and oxygen or the like can also be used depending on the situation.

As the apparatus for performing the heat treatment, an epitaxial growth system can be used, and the epitaxial deposition can be continuously performed following to the heat treatment. Thereby, it can be processed at high productivity. When performing heat treatment comparatively for a long time, it is efficient to perform a batch process using a heat treatment furnace with a heater heating system which can subject dozens or more of wafers to heat treatment simultaneously.

After performing the heat treatment which forms BMDs with a size having a gettering capability in a bulk of this silicon single crystal wafer, a silicon epitaxial layer is formed on a surface of the wafer. This epitaxial growth can be performed according to a general CVD method. According to this CVD method, epitaxial growth of the silicon is carried out on a silicon single crystal wafer, for example, by introducing a trichlorosilane into an epitaxial growth furnace with a radiation heating system wherein a susceptor on which a silicon substrate is to be placed is located in a cylinder type bell jar.

As described above, in the present invention, $10^8$ numbers/cm$^3$ or more of oxide precipitates (BMDs) with a radius of 10 nm or more exist in an epitaxial wafer before a device process. Accordingly, even if a device process is performed by RTA, for a short time or at low temperature, a sufficient gettering capability can be achieved. In a conventional-nitrogen doped epitaxial wafer, in the case that the subsequent device process is performed by RTA or at a low temperature, the size does not grow into 10 nm or more and thus the gettering capability cannot be sufficiently achieved in some cases, even though a density of BMDs is $10^8$ numbers/cm$^3$.

The following examples and comparative examples are submitted to further explain the present invention. They are not intended to limit the scope of the present invention.

EXAMPLE 1

According to the CZ method, a crystal ingot with a diameter of 8 inches, initial oxygen concentration of 14 ppma (JEIDA specification), and orientation <100> was pulled. At that time, a silicon wafer having a silicon nitride film was put in a raw material beforehand with controlling so that concentration of nitrogen might be $3 \times 10^{13}$ numbers/cm$^3$. This crystal ingot was processed to produce a substrate wafer.

After subjecting this substrate wafer to oxygen precipitation heat treatment (at 800° C. for 2 hr)+(at 1000° C. for 8 hr) in nitrogen atmosphere, 3 µm of an epitaxial layer was deposited. Epitaxial growth was performed by introducing a trichlorosilane at a temperature of 1125° C. using an epitaxial growth furnace with the radiation heating system wherein a susceptor on which a silicon substrate is to be placed is located in a cylinder type bell jar. BMDs in a bulk of this epitaxial wafer were measured according to LST (light-scattering tomography method).

The LST is a method comprising irradiating a laser beam at a semiconductor, monitoring the scattered light scattered by defects inside the semiconductor, and observing a distribution of the defects inside the semiconductor as a tomogram. If it is applied to measurement of BMDs in a silicon wafer, a density, a size, a distribution, or the like of BMDs can be measured.

A density of BMDs was measured in this way, and as a result, the density of BMDs was $10^9$ numbers/cm$^3$. The radius of BMDs assumed to be spherical at that time was about 40 nm on the average.

When the shallow pits generated on a surface were observed with an optical microscope after this wafer was intentionally contaminated with Ni (nickel), shallow pits were not observed, and it was revealed that the epitaxial wafer of Example 1 has a high gettering capability.

It was revealed from this result that since the density of BMDs which have a sufficient size is high in the epitaxial wafer according to the present invention, the epitaxial wafer excellent in a gettering capability can be produced. Especially, since it was not necessary to generate BMDs with the subsequent heat treatment, the wafer which has a gettering capability could be produced irrespective of a device process and from the early stage of the device process.

EXAMPLE 2

A silicon single crystal ingot was pulled with doping nitrogen according to CZ method as described in Example 1, and then processed into a substrate wafer.

After subjecting this substrate wafer to the heat treatment for shorter time than Example 1 of (at 850° C. for 1 hr)+(at 1100° C. for 2 hr), 3 µm of an epitaxial layer was deposited as described in Example 1. BMDs in a bulk of this epitaxial wafer were measured according to LST as described in Example 1.

As a result of measuring a density of BMDs, the density of BMDs was $4 \times 10^9$ numbers/cm$^3$. The radius of BMDs assumed to be spherical at that time was about 35 nm on the average.

When the shallow pits generated on a surface were observed with an optical microscope after this wafer was intentionally contaminated with Ni as described in Example 1, shallow pits were not observed, and it was revealed that the epitaxial wafer of Example 2 has a high gettering capability.

From this result, it was revealed that the effectiveness of the present invention can be achieved also in shorter heat treatment time.

COMPARATIVE EXAMPLE 1

A silicon single crystal ingot was pulled with doping nitrogen according to CZ method as described in Example 1, and then processed into a substrate wafer.

3 µm of an epitaxial layer was directly deposited on this substrate wafer without subjecting to the heat treatment before epitaxial growth which was conducted in Example 1 and Example 2. BMDs in a bulk of this epitaxial wafer was measured according to LST as described in Example 1.

As a result of measuring a density of BMDs, the density of detected BMDs was $10^7$ numbers/cm$^3$.

When the shallow pits generated on a surface were observed with an optical microscope after this wafer was intentionally contaminated with Ni as described in Example 1, a lot of shallow pits were observed, and it was revealed that the epitaxial wafer of Comparative example 1 lacks a gettering capability.

COMPARATIVE EXAMPLE 2

A silicon single crystal ingot was pulled in the same method as Example 1 except that nitrogen was not doped, and then processed into a substrate wafer.

After subjecting this substrate wafer to the heat treatment for oxygen precipitation of (at 800° C. for 2 hr)+(at 1000° C. for 8 hr) under nitrogen atmosphere, 3 µm of an epitaxial layer was deposited as described in Example 1. A density of BMDs in a bulk of the wafer was measured for this epitaxial wafer according to LST as described in Example 1.

As a result of measuring a density of BMD, the density of BMDs was $10^7$ numbers/cm$^3$.

When the shallow pits generated on a surface was observed with an optical microscope after this wafer was intentionally contaminated with Ni as described in Example 1, a lot of shallow pits were observed, and it was revealed that the epitaxial wafer of Comparative Example 2 lacks a gettering capability.

The present invention is not limited to the above-described embodiment. The above-described embodiments are mere examples, and wafers having substantially the same constitution as the technical idea described in the claims of the present invention and providing the similar action and effects are all included in the scope of the present invention.

For example, in the present invention, the conditions of heat treatment before epitaxial growth are not required strictly, and epitaxial silicon wafers having similar effects obtained by subjecting them to the heat treatment at different temperature for different time or to a combination of several steps of heat treatment processes are also included in the scope of the present invention.

The invention claimed is:

1. A method for producing an epitaxial wafer, comprising:
    pulling a silicon single crystal, in which nitrogen is doped to a concentration of $10^{13}$ to $10^{14}$ atoms/cm$^3$, by Czochralski method,
    processing the silicon single crystal into a wafer to produce a silicon single crystal wafer,
    subjecting the silicon single crystal wafer to a two-stage heat treatment so that a density of oxide precipitates having such a size that a gettering capability can be achieved in bulk of the wafer may be $10^8$/cm$^3$ or more, the two-stage heat treatment consisting of:

heating the silicon single crystal wafer at 600° C.–1000° C. for 0.5 hours to 8 hours, and subsequently heating the silicon single crystal wafer at 800° C.–1150° C. for 0 hour to 10 hours; and subjecting the silicon single crystal wafer to epitaxial growth.

* * * * *